(12) United States Patent
Ji et al.

(10) Patent No.: US 9,390,990 B2
(45) Date of Patent: Jul. 12, 2016

(54) MOLDING COMPOSITION FOR SEMICONDUCTOR PACKAGE AND SEMICONDUCTOR PACKAGE USING THE SAME

(71) Applicant: SAMSUNG ELECTRO-MECHANICS CO., LTD., Suwon-Si (KR)

(72) Inventors: Soo Young Ji, Suwon-Si (KR); Seung Hwan Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 111 days.

(21) Appl. No.: 14/290,628

(22) Filed: May 29, 2014

(65) Prior Publication Data

US 2015/0028498 A1    Jan. 29, 2015

(30) Foreign Application Priority Data

Jul. 29, 2013    (KR) ........................ 10-2013-0089604

(51) Int. Cl.
| | | |
|---|---|---|
| *H01L 23/29* | (2006.01) | |
| *H01B 3/30* | (2006.01) | |
| *H05K 1/03* | (2006.01) | |
| *C09K 19/54* | (2006.01) | |
| *C08K 3/20* | (2006.01) | |
| *C08L 63/00* | (2006.01) | |
| *C08L 63/04* | (2006.01) | |
| *C08L 67/03* | (2006.01) | |
| *C09K 19/38* | (2006.01) | |
| *H01L 25/10* | (2006.01) | |

(Continued)

(52) U.S. Cl.
CPC ............. *H01L 23/295* (2013.01); *C08K 3/20* (2013.01); *C08L 63/00* (2013.01); *C08L 63/04* (2013.01); *C08L 67/03* (2013.01); *C09K 19/3809* (2013.01); *H01L 25/105* (2013.01); *C09K 2019/521* (2013.01); *H01L 23/3128* (2013.01); *H01L 2224/131* (2013.01); *H01L 2224/16227* (2013.01); *H01L 2224/2919* (2013.01); *H01L 2224/32225* (2013.01); *H01L 2225/1023* (2013.01); *H01L 2225/1058* (2013.01); *H01L 2225/1094* (2013.01); *H01L 2924/12042* (2013.01); *H01L 2924/15311* (2013.01); *H01L 2924/15331* (2013.01); *H01L 2924/181* (2013.01); *H01L 2924/3511* (2013.01)

(58) Field of Classification Search
CPC .......... H01B 3/40; H01B 3/42; H01L 23/295; H05K 1/0373; H05K 1/0353; H05K 1/0346; H05K 2201/0141; C08K 3/04; C08K 3/30; C09K 19/3483; C09K 19/1952; C09K 19/3823
See application file for complete search history.

(56) References Cited

U.S. PATENT DOCUMENTS 8,940,186 B2 *   1/2015   Ji ........................... C08K 5/057
                                                                  252/299.6
9,045,646 B2 *   6/2015   Ji ............................. C09D 5/00

(Continued)

FOREIGN PATENT DOCUMENTS

JP          2010-239150         10/2010

*Primary Examiner* — Shean C Wu
(74) *Attorney, Agent, or Firm* — NSIP Law (57) ABSTRACT

Disclosed herein are a molding composition for a semiconductor package including a liquid crystal thermosetting polymer resin and graphene oxide to thereby effectively decrease coefficient of thermal expansion (CTE) and warpage and maximize an effect of thermal conductivity, and a semiconductor package using the same.

11 Claims, 2 Drawing Sheets

(51) Int. Cl.
  *H01L 23/31* (2006.01)
  *C09K 19/52* (2006.01)

(56) References Cited

U.S. PATENT DOCUMENTS

2013/0099149 A1* 4/2013 Ji .......................... C08K 5/057
                                                    252/62
2013/0281575 A1* 10/2013 Ji ............................ C09D 5/00
                                                    523/455
2014/0170412 A1* 6/2014 Ji .......................... C09D 7/1233
                                                    428/332
2014/0187674 A1* 7/2014 Lee ........................ C09J 185/02
                                                    523/435
2014/0187687 A1* 7/2014 Ji .......................... H05K 1/0373
                                                    524/114

* cited by examiner

MOLDING COMPOSITION FOR SEMICONDUCTOR PACKAGE AND SEMICONDUCTOR PACKAGE USING THE SAME

CROSS REFERENCE TO RELATED APPLICATION

This application claims the benefit of Korean Patent Application No. 10-2013-0089604, filed on Jul. 29, 2013, entitled "Molding Composition for Semiconductor Package And Semiconductor Package Using the Same", which is hereby incorporated by reference in its entirety into this application.

BACKGROUND OF THE INVENTION

1. Technical Field

The present invention relates to a molding composition for a semiconductor package and a semiconductor package using the same.

2. Description of the Related Art

In accordance with development of electronic devices, a semiconductor has progressed to have a light weight, a thin thickness, and a small size, such that a semiconductor circuit becomes more complicated and highly densified. Due to this trend, electrical, thermal, and mechanical stability of molding materials have been required as more important factors. In particular, a heat generation problem generated in an application processor (AP) of a mobile product may have a significant influence on performance and reliability of the mobile product. A molding process, which is a process of sealing a semiconductor using a mold compound, is a semiconductor package molding method progressing in order to protect a semiconductor chip from external environment, provide an electrical insulation effect, and effectively radiate heat at the time of operating a chip. In fact, a purpose of the molding is to protect a semiconductor in which wire bonding or flip chip bonding is completed from electrical deterioration due to various reasons such as corrosion by air or external environment, and the like, provide mechanical stability, and effectively radiate heat generated in the semiconductor.

In general, as molding materials of the semiconductor package, an epoxy molding compound (EMC) which is a thermosetting resin is used. However, the epoxy molding compound has a limitation in decreasing coefficient of thermal expansion (CTE), warpage, and improving thermal conductivity, and in order to overcome the limitation, a method of adding a filler of an inorganic material was suggested, however, the method has also a limitation in view of a filling amount.

Meanwhile, Patent Document 1 discloses an insulation resin for a semiconductor module including a thermosetting resin and an inorganic filler; however, there is a limitation in decreasing warpage and CTE.

PRIOR ART DOCUMENT

Patent Document

Patent Document 1 Japanese Patent Laid-Open Publication No. JP 2010-239150

SUMMARY OF THE INVENTION

The present inventors found that a molding composition for a semiconductor package including a liquid crystal thermosetting polymer resin, and graphene oxide, is provided to effectively decrease coefficient of thermal expansion (CTE) and warpage and maximize a heat radiation effect, thereby completing the present invention.

The present invention has been made in an effort to provide a molding composition for a semiconductor package including a liquid crystal thermosetting polymer resin, and graphene oxide, in order to decrease coefficient of thermal expansion (CTE) and warpage and increase a heat radiation effect.

In addition, the present invention has been made in an effort to provide a semiconductor package formed by using the molding composition.

Further, the present invention has been made in an effort to provide a semiconductor package including solder bumps electrically connecting an upper package and a lower package respectively manufactured by using the molding composition.

According to a preferred embodiment of the present invention, there is provided a molding composition for a semiconductor package including: a liquid crystal thermosetting polymer resin; and graphene oxide.

The molding composition may contain the liquid crystal thermosetting polymer resin having a content of 5 to 50 wt %, and the graphene oxide having a content of 50 to 95 wt %.

The liquid crystal thermosetting polymer resin may be represented by the following Chemical Formula 1:

[Chemical Formula 1]

in Chemical Formula 1 above, $R_1$ and $R_2$ are identically or differently $CH_3$ or $H$, but at least one of $R_1$ and $R_2$ is $CH_3$, and $Ar_1$ is a bivalent aromatic organic group including at least one structure unit selected from ester, amide, ester amide, ester imide and ether imide and having a molecular weight of 5000 or less.

$Ar_1$ may include at least one structure unit selected from a group consisting of the following structure units:

-continued wherein n and m are an integer of 1 to 100, and Ar$_2$, Ar$_4$, Ar$_5$ and Ar$_6$, which are bivalent aromatic organic groups, include at least one structure unit selected from a group consisting of the following structure units:

and

Ar$_3$, which is a tetravalent aromatic organic group, includes at least one structure unit selected from a group consisting of the following structure units:

The graphene oxide may have at least one functional group selected from a group consisting of a hydroxyl group, a carboxyl group and an epoxide group on a surface and an edge thereof.

The molding composition may further include an epoxy resin.

The epoxy resin may be contained in 1 to 15 parts by weight based on 100 parts by weight of the molding composition, and may be at least one selected from a group consisting of a naphthalene-based epoxy resin, a bisphenol A-type epoxy resin, a bisphenol F-type epoxy resin, a phenol novolac epoxy resin, a cresol novolac epoxy resin, a rubber modified epoxy resin and a phosphorus-based epoxy resin.

The molding composition may further include a curing agent and a curing accelerator.

The curing agent may be contained in 0.1 to 10 parts by weight based on 100 parts by weight of the molding composition, and may be at least one selected from a group consisting of an amide-based curing agent, an acid anhydride-based curing agent, a polyamine curing agent, a polysulfide curing agent, a phenol novolac-type curing agent, a bisphenol A-type curing agent, and a dicyandiamide curing agent.

The curing accelerator may be contained in 0.1 to 1 part by weight based on 100 parts by weight of the molding composition, and may be at least one selected from a group consisting of a metal-based curing accelerator, an imidazole-based curing accelerator and an amine-based curing accelerator.

According to another preferred embodiment of the present invention, there is provided a semiconductor package including: a printed circuit board on which a semiconductor chip is mounted; and a molding material formed on the printed circuit board, wherein the molding material is made of the molding composition as described above.

According to another preferred embodiment of the present invention, there is provided a semiconductor package including: a first printed circuit board on which a first semiconductor chip is mounted; an upper package containing a first molding material formed on the first printed circuit board; a second printed circuit board on which a second semiconductor chip is mounted; a lower package containing a second molding material formed on the second printed circuit board; and solder bumps electrically connecting the upper package and the lower package, wherein the first molding material and the second molding material are made of the molding composition as described above.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Before the present invention is described in more detail, it must be noted that the terms and words used in the present specification and claims should not be interpreted as being limited to typical meanings or dictionary definitions, but should be interpreted as having meanings and concepts relevant to the technical scope of the present invention based on the rule according to which an inventor can appropriately define a concept implied by a term to best describe the method he or she knows for carrying out the invention. Further, the embodiments of the present invention are merely illustrative, and are not to be construed to limit the scope of the present invention, and thus there may be a variety of equivalents and modifications able to substitute for them at the point of time of the present application.

In the following description, it is to be noted that embodiments of the present invention are described in detail so that the present invention may be easily performed by those skilled in the art, and also that, when known techniques related to the present invention may make the gist of the present invention unclear, a detailed description thereof will be omitted.

Figure 1:
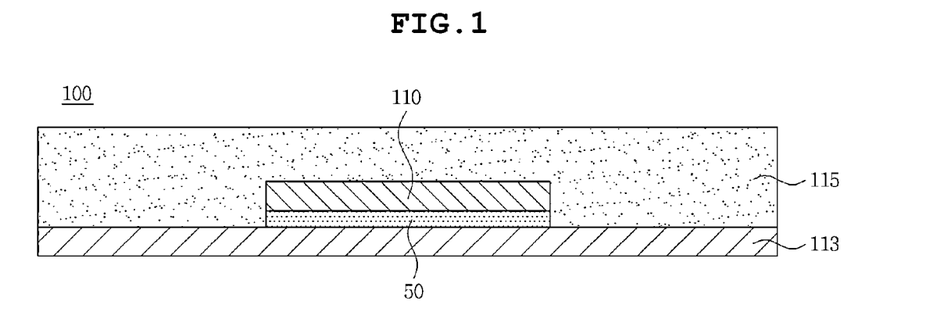
FIG. 1 is a cross-sectional view showing a semiconductor package formed by using a molding composition according to a preferred embodiment of the present invention.

FIG. 1 is a cross-sectional view of a semiconductor package 100 to which a molding composition according to a preferred embodiment of the present invention is applicable. Referring to FIG. 1, a first molding material 115 is formed in order to protect the semiconductor package from electrical deterioration due to various reasons such as corrosion by air or external environment, and the like, on a first printed circuit board 113 having a first semiconductor chip 110 mounted thereon. In addition, the first semiconductor chip 110 and the first printed circuit board 113 may be connected by solder bumps 30 or underfill 50 therebetween, but the present invention is not particularly limited thereto.

Figure 2:
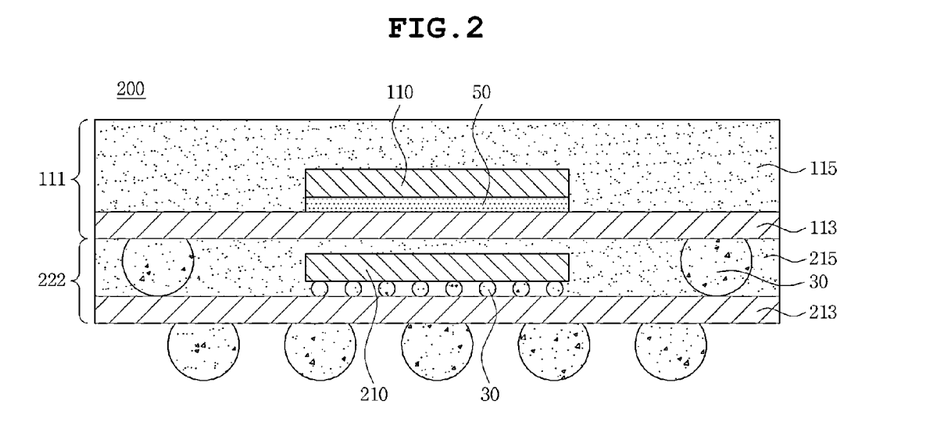
FIG. 2 is a cross-sectional view showing a semiconductor package including solder bumps electrically connecting an upper package and a lower package respectively manufactured by using a molding composition according to another preferred embodiment of the present invention.

FIG. 2 is a cross-sectional view showing a semiconductor package 200 formed by connecting an upper package 111 and a lower package 222 using solder bumps 30, the upper package and the lower package respectively manufactured by using a molding composition according to another preferred embodiment of the present invention. Referring to FIG. 2, the semiconductor package 200 is formed by connecting the upper package 111 in which first molding materials 115 are stacked on the first printed circuit board 113 having a first semiconductor chip 110 mounted thereon and the lower package 222 in which second molding materials 215 are stacked on a second printed circuit board 213 having a second semiconductor chip 210 mounted thereon, using solder bumps 30, which is referred to as a package on package. In addition, the first semiconductor chip 110 and the second semiconductor chip 210 and the first printed circuit board 113 and the second printed circuit board 213 may be connected by solder bumps 30 or underfill 50 therebetween, but the present invention is not particularly limited thereto.

Meanwhile, the molding composition for semiconductor package according to a representatively preferred embodiment of the present invention includes a liquid crystal thermosetting polymer resin, and graphene oxide.

Liquid Crystal Thermosetting Polymer Resin

A molding composition for a semiconductor package according to the preferred embodiment of the present invention contains a liquid crystal thermosetting polymer resin, for example, a liquid crystal thermosetting polymer resin having coefficient of thermal expansion (CTE) of 3 to 10 ppm/° C. and thermal conductivity of 1 to 7 W/mK. The liquid crystal thermosetting polymer resin has excellent CTE and thermal conductivity as compared to the existing epoxy resin used as a composition in an epoxy molding compound (EMC). The liquid crystal thermosetting polymer resin may have its own structure in which liquid crystal property is implemented and may simultaneously have a soluble structure in which the polymer is well dissolved into a solvent at a main chain portion, and portions having a structure which is cured by heat may exist at both ends.

The liquid crystal thermosetting polymer resin may have a content of 5 to 50 wt %, and in particular, it is preferred that the content of the liquid crystal thermosetting polymer resin is 5 to 20 wt %. But, the present invention is not particularly limited thereto. In the case in which a content of the used liquid crystal thermosetting polymer resin is less than 5 wt %, dispersibility of graphene oxide in the molding composition may be deteriorated and interfacial delamination may occur, and in the case in which a content thereof is more than 50 wt %, improvement in thermal conductivity may not be significantly shown.

The liquid crystal thermosetting polymer resin may be represented by the following Chemical Formula 1:

[Chemical Formula 1]

in Chemical Formula 1 above, $R_1$ and $R_2$ are identically or differently $CH_3$ or H, but at least one of $R_1$ and $R_2$ is $CH_3$, and $Ar_1$ is a bivalent aromatic organic group including at least one structure unit selected from ester, amide, ester amide, ester imide and ether imide and having a molecular weight of 5000 or less.

$Ar_1$ includes at least one structure unit selected from a group consisting of the following structure units:

wherein n and m are an integer of 1 to 100, and $Ar_2$, $Ar_4$, $Ar_5$ and $Ar_6$, which are bivalent aromatic organic groups, include at least one structure unit selected from a group consisting of the following structure units:

and $Ar_3$, which is a tetravalent aromatic organic group, includes at least one structure unit to selected from a group consisting of the following structure units:

Graphene Oxide

The molding composition for a semiconductor package according to the preferred embodiment of the present invention may contain graphene oxide (GO). The GO may have CTE of 0 to 1 ppm/° C. and thermal conductivity of 15 to 50 W/mK, and may function as a filler in the composition.

In addition, the graphene oxide may include a plurality of hydroxyl groups, carboxyl groups and epoxide groups on a surface and an edge thereof. The graphene may form a covalent bond by a curing reaction with the liquid crystal thermosetting polymer resin, and therefore, may be an organically connected composite.

Figure 3:
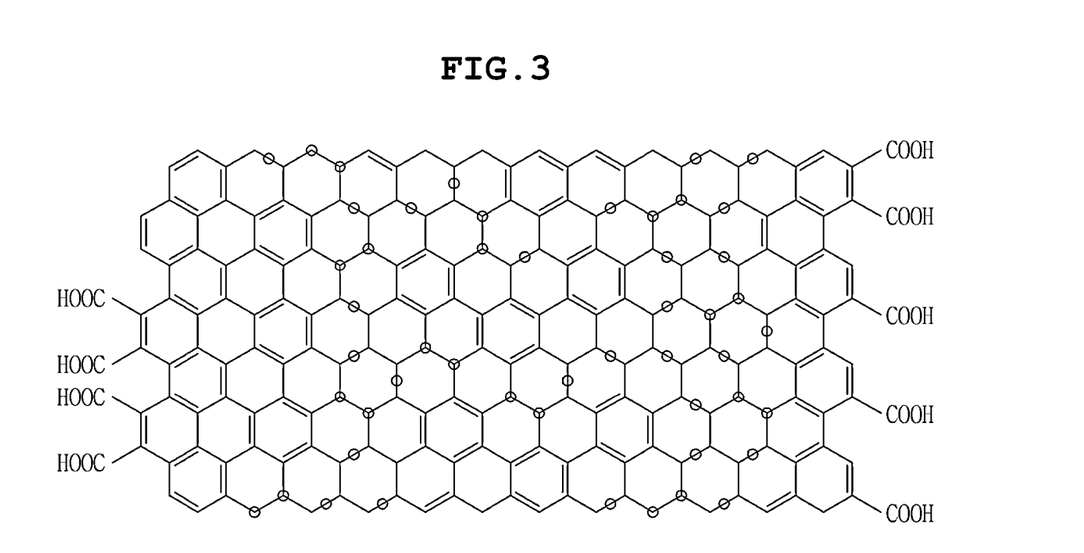
FIG. 3 schematically shows a portion of a structure of graphene oxide according to a preferred embodiment of the present invention.

Referring to FIG. 3, the graphene oxide may include a plurality of functional groups such as hydroxyl groups, carboxyl groups and epoxide groups on a surface and an edge thereof. The kind and the number of functional groups may vary depending on an oxidation method of graphene oxide or an oxidation degree thereof.

The graphene oxide may be physically dispersed in the cured liquid crystal polymer resin, and may form a chemical bond by the functional groups. The graphene oxide having the functional groups may form a covalent bond by a curing reaction with the liquid crystal thermosetting polymer resin, and therefore, may be an organically connected composite. Specifically, at the time of curing a composition containing the liquid crystal thermosetting polymer resin and the graphene oxide, curing reactions between the liquid crystal thermosetting polymer resin-the graphene oxide, the liquid crystal thermosetting polymer resin-the liquid crystal thermosetting polymer resin, and the graphene oxide-the graphene oxide are generated, such that an organically interconnected composite material may be formed.

The graphene oxide in the molding composition for a semiconductor package according to the preferred embodiment of the present invention may have a content of 50 to 95 wt %, and in particular, it is preferred that a content of the graphene oxide is 80 to 95 wt %. In the case in which a content of the used graphene oxide is less than 50 wt %, improvement in thermal conductivity may not be significantly shown, and in the case in which a content thereof is more than 95 wt %, dispersibility of graphene oxide in the molding composition may be deteriorated and interfacial delamination may occur.

Epoxy Resin

The molding composition for a semiconductor package according to the preferred embodiment of the present invention may further contain an epoxy resin. In the case in which the epoxy resin is added to the liquid crystal thermosetting polymer resin, CTE and warpage may be decreased and thermal conductivity may be increased, and peel strength may also be improved.

The epoxy resin may be at least one selected from a group consisting of a naphthalene-based epoxy resin, a bisphenol A-type epoxy resin, a bisphenol F-type epoxy resin, a phenol novolac epoxy resin, a cresol novolac epoxy resin, a rubber modified epoxy resin and a phosphorus-based epoxy resin.

The epoxy resin may be contained in 1 to 15 parts by weight based on 100 parts by weight of the molding composition, but the present invention is not particularly limited thereto. In the case in which a content of the used epoxy resin is less than 1 part by weight, adhesion between the molding material on the semiconductor package and a substrate may be deteriorated, and in the case in which a content thereof is more than 15 parts by weight, due to an epoxy resin which is not reacted in the molding composition, CTE may not be decreased, heat radiation property may not be improved, and warpage may also occur.

Curing Agent

The molding composition for a semiconductor package according to the preferred embodiment of the present invention may further contain a curing agent. In addition, the molding composition further containing the epoxy resin may contain a curing agent. The curing agent may be contained in 0.1 to 10 parts by weight based on 100 parts by weight of the molding composition, but the present invention is not particularly limited thereto. In the case in which a content of the used curing agent is less than 0.1 part by weight, a curing rate may be deteriorated, and in the case in which a content thereof is more than 10 parts by weight, a non-reacted curing agent may exist to increase moisture-absorption rate of the molding material, such that insulation property may be deteriorated.

The curing agent may be at least one selected from a group consisting of an amide-based curing agent, an acid anhydride-based curing agent, a polyamine curing agent, a polysulfide curing agent, a phenol novolac-type curing agent, a bisphenol A-type curing agent, and a dicyandiamide curing agent.

Curing Accelerator

The molding composition for a semiconductor package according to the preferred embodiment of the present invention may further contain a curing accelerator. In addition, the molding composition further containing the epoxy resin may contain a curing accelerator. The curing accelerator may be contained in 0.1 to 1 part by weight based on 100 parts by weight of the molding composition. Examples of the curing accelerator to be applied may include a metal-based curing accelerator, an imidazole-based curing accelerator and an amine-based curing accelerator.

Examples of the metal-based curing accelerator may include an organic metal complex or an organic metal salt of a metal such as cobalt, copper, zinc, iron, nickel, manganese, tin, or the like, but the present invention is not particularly limited thereto. Specific examples of the organic metal complex may include organic cobalt complex such as cobalt (II) acetylacetonate, cobalt (III) acetylacetonate, or the like, organic copper complex such as copper (II) acetylacetonate, organic zinc complex such as zinc (II) acetylacetonate, organic iron complex such as iron (III) acetylacetonate, organic nickel complex such as Ni (II) acetylacetonate, organic manganese complex such as manganese (II) acetylacetonate, and the like. Examples of the organic metal salts may include zinc octyl acid, tin octyl acid, zinc naphthenic acid, cobalt naphthenic acid, tin stearic acid, zinc stearic acid, and the like. As the metal-based curing accelerator, cobalt (II) acetylacetonate, cobalt (III) acetylacetonate, zinc (II) acetylacetonate, zinc naphthenic acid and iron (III) acetylacetonate are preferred in view of curability and solvent solubility, and in particular, cobalt (II) acetylacetonate or zinc naphthenic acid is more preferred. One kind of the metal-based curing accelerator or a combination of two or more thereof may be used.

Examples of the imidazole-based curing accelerator may include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazoliumtrimellitate, 1-cyanoethyl-2-phenylimidazoliumtrimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4- diamino-6-[2'-methylimidazolyl-(1')]-ethyl-s-triazineisocyanic acid adduct, 2-phenyl-imidazoleisocyanic acid adduct, 2-phenyl-4,5-dihydroxymethylimidazole, 2-phenyl-4-methyl-5-hydroxymethylimidazole, 2,3-dihydroxy-1H-pyroro[1,2-a]benzimidazole, 1-dodecyl-2-methyl-3-benzyl-imidazoliumchloride, 2-methylimidazoline, and 2-phenyl-imidazoline, and an adduct of the imidazole compounds and the epoxy resin. One kind of the imidazole-based curing accelerator or a combination of two or more thereof may be used.

Examples of the amine-based curing accelerator may include trialkylamine such as triethylamine, tributylamine, or the like, and an amine compound such as 4-dimethylaminopyridine, benzyldimethylamine, 2,4,6-tris(dimethylamino-methyl)phenol, 1,8-diazabicyclo(5,4,0)-undecene, or the like, but the present invention is not particularly limited thereto. One kind of the amine-based curing accelerator or a combination of two or more thereof may be used.

A semiconductor package may be formed by using the molding composition for a semiconductor package according to the preferred embodiment of the present invention.

In order to protect the semiconductor chip on the printed circuit board having the semiconductor chip mounted thereon from external environment, provide an insulation property, and effectively emit heat generated at the time of operating the chip, the semiconductor package may be sealed by a molding material. Here, the molding material may be formed by applying the molding composition according to the preferred embodiment of the present invention thereto.

In addition, a semiconductor package having a shape of a package on package may also be formed by vertically interconnecting the semiconductor package through the solder bumps electrically connecting the semiconductor package formed by using the molding composition.

Hereinafter, the present invention will be described in more detail with reference to the following examples and comparative examples; however, it is not limited thereto.

Preparation Example 1

Preparation of Liquid Crystal Thermosetting Polymer 218.26 g (2.0 mol) of 4-aminophenol, 747.59 g (4.5 mol) of isophthalic acid, 276.24 g (2.0 mol) of 4-hydroxybenzoic acid, 282.27 g (1.5 mol) of 6-hydroxy-2-naphthoic acid, 648.54 g (2.0 mol) of 9,10-dihydroxy-9-oxa-10-phosphaphenanthrene-10-oxide (DOPO), 1531.35 g (15.0 mol) of acetic anhydride were added to a 20 L glass reactor. After the inside of the reactor was sufficiently substituted using nitrogen gas, a temperature in the reactor was increased to 230° C. under a nitrogen gas flow, and a reflux was performed for 4 hours while maintaining the temperature in the reactor at 230° C. Then, after 188.18 g (1.0 mol) of 6-hydroxy-2-naphthoic acid for end capping was further added thereto, an acetic acid which is a reaction by-product and a non-reacted acetic acid anhydride were removed therefrom, thereby preparing a liquid crystal thermosetting polymer.

Example 1

120 g of graphene oxide was dispersed into a methyl ethyl ketone (MEK) solvent to prepare a graphene oxide slurry having a concentration of 80 wt %. Then, 30 g of the liquid crystal thermosetting polymer prepared by Preparation Example 1 above was added to the prepared graphene oxide slurry, followed by stirring at approximately 300 rpm at room temperature (25° C.) to be dissolved, thereby preparing a mixture. Next, 7.5 g of a dicyandiamide (DICY) curing agent and 1 g of an imidazole-based curing accelerator (2PHZ-PW, Shikoku Chemicals) were added to the mixture, followed by additional stiffing at about 300 μm for 1 hour, thereby preparing a molding composition. With respect to the total weight of the varnish as prepared above, a solid content weight was 80 wt %. The varnish was applied on a released polyethylene terephthalate (PET) film so as to have a thickness of about 100 μm by a doctor blade scheme, thereby manufacturing a sample. The sample was dried at room temperature (25° C.) for about 2 hours, and dried in a vacuum oven at about 80° C. for 1 hour, and then dried at about 110° C. for 1 hour, thereby manufacturing the sample in B-stage state. The sample was completely cured using a vacuum press. Here, the highest temperature was about 230° C., and the highest pressure was about 2 MPa.

Example 2

120 g of graphene oxide was dispersed into a methyl ethyl ketone (MEK) solvent to prepare a graphene oxide slurry having a concentration of 80 wt %. Then, 30 g of the liquid crystal thermosetting polymer prepared by Preparation Example 1 above together with 15 g of 4-functional group naphthalene-based epoxy resin (HP-4710, DIC) were added to the prepared graphene oxide slurry, followed by stirring at about 300 rpm at room temperature (25° C.) to be dissolved, thereby preparing a mixture. Then, a sample of Example 2 was manufactured by the same condition and method as Example 1 above.

Example 3

142.5 g of graphene oxide was dispersed into a methyl ethyl ketone (MEK) solvent to prepare a graphene oxide slurry having a concentration of 95 wt %. Then, 7.5 g of the liquid crystal thermosetting polymer prepared by Preparation Example 1 above was added to the prepared graphene oxide slurry, followed by stirring at approximately 300 rpm at room temperature (25° C.) to be dissolved, thereby preparing a mixture. Then, a sample of Example 3 was manufactured by the same condition and method as Example 1 above.

Comparative Example 1

120 g of silica ($SiO_2$) having an average particle size distribution of 0.2 to 1 μm was dispersed into 2-methoxy ethanol, thereby preparing a silica slurry having a concentration of 80 wt %. Then, 30 g of 4-functional group naphthalene-based epoxy resin (HP-4710, DIC) was added to the prepared graphene oxide slurry, followed by stirring at about 300 rpm at room temperature (25° C.) to be dissolved, thereby preparing a mixture. Next, 7.5 g of a dicyandiamide (DICY) curing agent and 1 g of an imidazole-based curing accelerator (2PHZ-PW, Shikoku Chemicals) were added to the mixture, followed by additional stirring at about 300 rpm for 1 hour, thereby preparing a molding composition. With respect to the total weight of the varnish as prepared above, a solid content weight was 80 wt %. The varnish was applied on a released polyethylene terephthalate (PET) film so as to have a thickness of about 100 μm by a doctor blade scheme, thereby manufacturing a sample. The sample was dried at room temperature (25° C.) for about 2 hours, and dried in a vacuum oven at about 80° C. for 1 hour, and then dried at about 110° C. for 1 hour, thereby manufacturing the sample in B-stage state. The sample was completely cured using a vacuum press. Here, the highest temperature was about 230° C., and the highest pressure was about 2 MPa.

Comparative Example 2

135 g of silica (SiO$_2$) having an average particle size distribution of 0.2 to 1 μm was dispersed into 2-methoxy ethanol, thereby preparing a silica slurry having a concentration of 90 wt %. Then, 15 g of 4-functional group naphthalene-based epoxy resin (HP-4710, DIC) was added to the prepared graphene oxide slurry, followed by stirring at about 300 rpm at room temperature (25° C.) to be dissolved, thereby preparing a mixture. Then, a sample of Comparative Example 2 was manufactured by the same condition and method as Comparative Example 1 above.

Comparative Example 3

142.5 g of silica (SiO$_2$) having an average particle size distribution of 0.2 to 1 μm was dispersed into 2-methoxy ethanol, thereby preparing a silica slurry having a concentration of 95 wt %. Then, 7.5 g of 4-functional group naphthalene-based epoxy resin (HP-4710, DIC) was added to the prepared graphene oxide slurry, followed by stirring at about 300 rpm at room temperature (25° C.) to be dissolved, thereby preparing a mixture. Then, a sample of Comparative Example 3 was manufactured by the same condition and method as Comparative Example 1 above.

Evaluation of Physical Properties

Coefficients of thermal expansion of samples manufactured by Examples and Comparative Examples were measured at temperature range of 50 to 100° C. using a thermo mechanical analyzer (TMA). Thermal conductivity of the samples were measured using TPA-501, and heat generation temperature of the semiconductor chips were measured by differential thermal analysis (DTA). In order to measure warpage property of the samples, the samples were molded by transfer molding scheme at about 180° C. for 1 minutes using a multi plunger system (MPS) molding machine to manufacture exposed thin quad glat packages (eTQFP) having a length of about 20 mm, a width of about 20 mm, and a thickness of about 1 mm as copper device. Then, a height difference between center of an upper surface in a diagonal direction and an end of edge of each eTQFP package was measured using a non-contact type laser measuring instrument. As the height difference become smaller, warpage property is excellent.

content of graphene oxide showed the best physical properties. In particular, it could be appreciated from measurement values of thermal conductivity and heat generation temperature of the semiconductor chip that Examples to which graphene oxide was applied as a filler showed excellent effect as compared to Comparative Examples to which silica (SiO$_2$) was applied. In addition, it could be confirmed from comparison between Examples 1 and 2 that the same content of liquid crystal thermosetting polymer resin and graphene oxide were applied to the molding composition of each Example, but the composition of Example 2 further contained the epoxy resin, such that CTE and thermal conductivity of Example 2 were improved.

Figure 4:
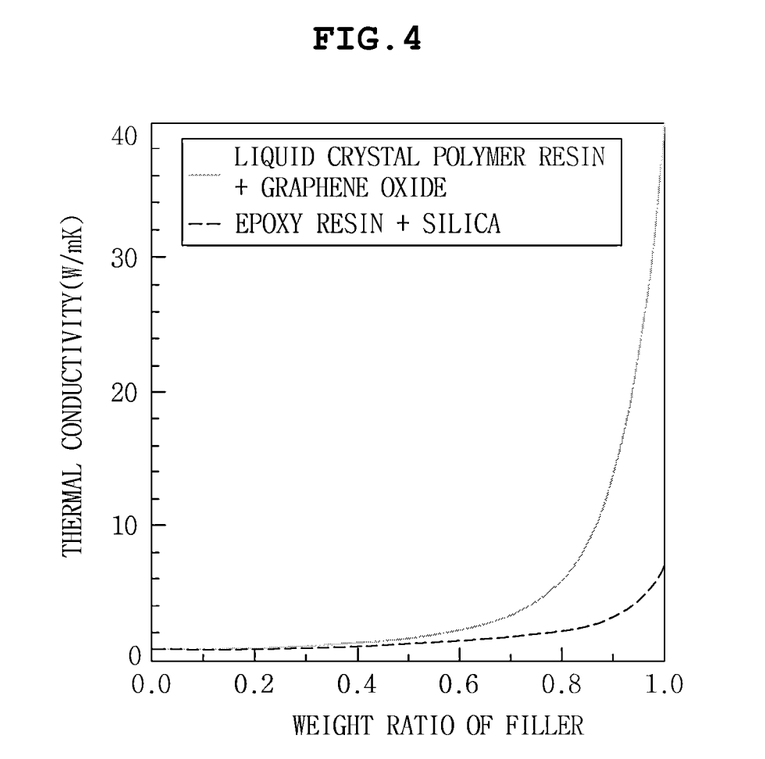
FIG. 4 is a graph showing thermal conductivity of samples manufactured by Example 3 and Comparative Example 3 of the present invention, according to a weight ratio of a filler.

FIG. 4 is a graph showing thermal conductivity of the samples manufactured by Example 3 and Comparative Example 3 of the present invention according to a weight ratio. It could be appreciated from FIG. 4 that thermal conductivity of Example 3, which is a sample manufactured by applying the molding composition containing the liquid crystal thermosetting polymer resin and graphene oxide according to the preferred embodiment of the present invention thereto, was higher than that of Comparative Example 3 manufactured by applying the existing molding composition containing the epoxy resin and silica thereto.

According to the preferred embodiments of the present invention, the molding composition for a semiconductor package may effectively decrease CTE and warpage and maximize a heat radiation effect.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A molding composition for a semiconductor package comprising:
    a liquid crystal thermosetting polymer resin;
    graphene oxide;
    a curing agent; and
    a curing accelerator.

TABLE 1

| Classification | Coefficient of Thermal Expansion (CTE) (ppm/° C.) | Thermal Conductivity (W/mK) | Heat Generation Temperature (° C.) of Chip | Warpage (μm) |
|---|---|---|---|---|
| Example 1 | 11 | 5.5 | 47.6 | −1.8 |
| Example 2 | 8.5 | 11 | 47.2 | −1.9 |
| Example 3 | 6 | 24 | 39.4 | −3.7 |
| Comparative Example 1 | 25 | 1.9 | 69.7 | 77.3 |
| Comparative Example 2 | 21 | 5.9 | 66.8 | 60.5 |
| Comparative Example 3 | 15 | 6.5 | 63.5 | 54.2 |

It could be appreciated from Table 1 above that CTE, thermal conductivity, heat generation temperature of semiconductor chip and warpage property of Examples 1, 2, and 3 were more excellent than those of Comparative Examples 1, 2, and 3, and in particular, Example 3 having the highest 2. The molding composition for a semiconductor package as set forth in claim 1, wherein the molding composition contains the liquid crystal thermosetting polymer resin having a content of 5 to 50 wt %, and the graphene oxide having a content of 50 to 95 wt %.

3. The molding composition for a semiconductor package as set forth in claim 1, wherein the liquid crystal thermosetting polymer resin is represented by the following Chemical Formula 1:

[Chemical Formula 1]

in Chemical Formula 1 above, $R_1$ and $R_2$ are identically or differently $CH_3$ or H, but at least one of $R_1$ and $R_2$ is $CH_3$, and $Ar_1$ is a bivalent aromatic organic group including at least one structure unit selected from ester, amide, ester amide, ester imide and ether imide and having a molecular weight of 5000 or less.

4. The molding composition for a semiconductor package as set forth in claim 3, wherein $Ar_1$ includes at least one structure unit selected from a group consisting of the following structure units:

wherein n and m are an integer of 1 to 100, and $Ar_2$, $Ar_4$, $Ar_5$ and $Ar_6$, which are bivalent aromatic organic groups, include at least one structure unit selected from a group consisting of the following structure units:

and to $Ar_3$, which is a tetravalent aromatic organic group, includes at least one structure unit selected from a group consisting of the following structure units:

-continued and.

5. The molding composition for a semiconductor package as set forth in claim 1, wherein the graphene oxide has at least one functional group selected from a group consisting of a hydroxyl group, a carboxyl group and an epoxide group on a surface and an edge thereof.

6. The molding composition for a semiconductor package as set forth in claim 1, further comprising: an epoxy resin.

7. The molding composition for a semiconductor package as set forth in claim 6, wherein the epoxy resin is contained in 1 to 15 parts by weight based on 100 parts by weight of the molding composition, and is at least one selected from a group consisting of a naphthalene-based epoxy resin, a bisphenol A-type epoxy resin, a bisphenol F-type epoxy resin, a phenol novolac epoxy resin, a cresol novolac epoxy resin, a rubber modified epoxy resin and a phosphorus-based epoxy resin.

8. The molding composition for a semiconductor package as set forth in claim wherein the curing agent is contained in 0.1 to 10 parts by weight based on 100 parts by weight of the molding composition, and is at least one selected from a group consisting of an amide-based curing agent, an acid anhydride-based curing agent, a polyamine curing agent, a polysulfide curing agent, a phenol novolac-type curing agent, a bisphenol A-type curing agent, and a dicyandiamide curing agent.

9. The molding composition for a semiconductor package as set forth in claim 1, wherein the curing accelerator is contained in 0.1 to 1 part by weight based on 100 parts by weight of the molding composition, and is at least one selected from a group consisting of a metal-based curing accelerator, an imidazole-based curing accelerator and an amine-based curing accelerator.

10. A semiconductor package comprising:
a printed circuit board on which a semiconductor chip is mounted; and
a molding material formed on the printed circuit board,
wherein the molding material is made of the molding composition as set forth in claim 1.

11. A semiconductor package comprising:
a first printed circuit board on which a first semiconductor chip is mounted;
an upper package containing a first molding material formed on the first printed circuit board;
a second printed circuit board on which a second semiconductor chip is mounted;
a lower package containing a second molding material formed on the second printed circuit board; and
solder bumps electrically connecting the upper package and the lower package,
wherein the first molding material and the second molding material are made of the molding composition as set forth in claim 1.

* * * * *